(12) United States Patent
Ding et al.

(10) Patent No.: US 9,481,924 B2
(45) Date of Patent: Nov. 1, 2016

(54) SEED LAYER FOR LOW-E APPLICATIONS

(71) Applicant: Intermolecular Inc., San Jose, CA (US)

(72) Inventors: Guowen Ding, San Jose, CA (US); Tong Ju, Santa Clara, CA (US); Minh Huu Le, San Jose, CA (US); Daniel Schweigert, Fremont, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 113 days.

(21) Appl. No.: 14/293,126

(22) Filed: Jun. 2, 2014

(65) Prior Publication Data

US 2015/0345005 A1 Dec. 3, 2015

(51) Int. Cl.
*B32B 15/04* (2006.01)
*B32B 17/06* (2006.01)
*C23C 14/02* (2006.01)
*C23C 14/06* (2006.01)
*C03C 17/00* (2006.01)

(52) U.S. Cl.
CPC .............. *C23C 14/024* (2013.01); *C03C 17/00* (2013.01); *C23C 14/0652* (2013.01); *Y10T 428/26* (2015.01)

(58) Field of Classification Search
USPC ....... 428/426, 428, 432, 433, 434, 688, 689, 428/697, 699, 701, 702
See application file for complete search history.

(56) References Cited

U.S. PATENT DOCUMENTS

| | | | | |
|---|---|---|---|---|
| 5,942,338 A | * | 8/1999 | Arbab | C03C 17/36 428/623 |
| 6,797,389 B1 | * | 9/2004 | Depauw | B32B 17/10036 427/163.1 |
| 7,846,549 B2 | | 12/2010 | Novis | |
| 8,497,014 B2 | * | 7/2013 | Unquera | C03C 17/36 428/215 |
| 8,506,001 B2 | | 8/2013 | Benito Gutirrez | |
| 8,559,100 B2 | | 10/2013 | O'Connor | |
| 2002/0102352 A1 | * | 8/2002 | Hartig | C03C 17/36 427/165 |
| 2004/0241406 A1 | * | 12/2004 | Nadaud | B32B 17/10036 428/212 |
| 2006/0257670 A1 | * | 11/2006 | Brochot | B32B 17/10174 428/432 |
| 2007/0009747 A1 | * | 1/2007 | Medwick | C03C 17/36 428/432 |
| 2007/0036989 A1 | * | 2/2007 | Medwick | C03C 17/36 428/432 |
| 2007/0237980 A1 | * | 10/2007 | Hartig | C03C 17/36 428/623 |
| 2008/0311389 A1 | * | 12/2008 | Roquiny | C03C 17/36 428/336 |
| 2009/0130409 A1 | * | 5/2009 | Reutler | B32B 17/10018 428/216 |
| 2009/0169846 A1 | * | 7/2009 | Siddle | C03C 17/36 428/216 |
| 2010/0124642 A1 | | 5/2010 | Lu | |
| 2010/0279144 A1 | | 11/2010 | Frank | |
| 2012/0225317 A1 | * | 9/2012 | Imran | C03C 17/36 428/630 |
| 2013/0057951 A1 | * | 3/2013 | Hevesi | C03C 17/36 359/359 |
| 2013/0344321 A1 | * | 12/2013 | McSporran | C03C 17/36 428/336 |

* cited by examiner

*Primary Examiner* — Lauren R Colgan

(57) ABSTRACT

Methods, and coated panels fabricated from the methods, are disclosed to form multiple coatings, (e.g., one or more infrared reflective layers), with minimal color change before and after heat treatments. For example, by adding appropriate seed layers between the IR reflective layers and the base oxide layers, the color performance can be maintained regardless of high temperature processes. The optical filler layers can include a metal oxide layer. In some embodiments, the seed layer can include nickel, titanium, and niobium, forming a nickel titanium niobium alloy such as NiTiNb.

19 Claims, 6 Drawing Sheets

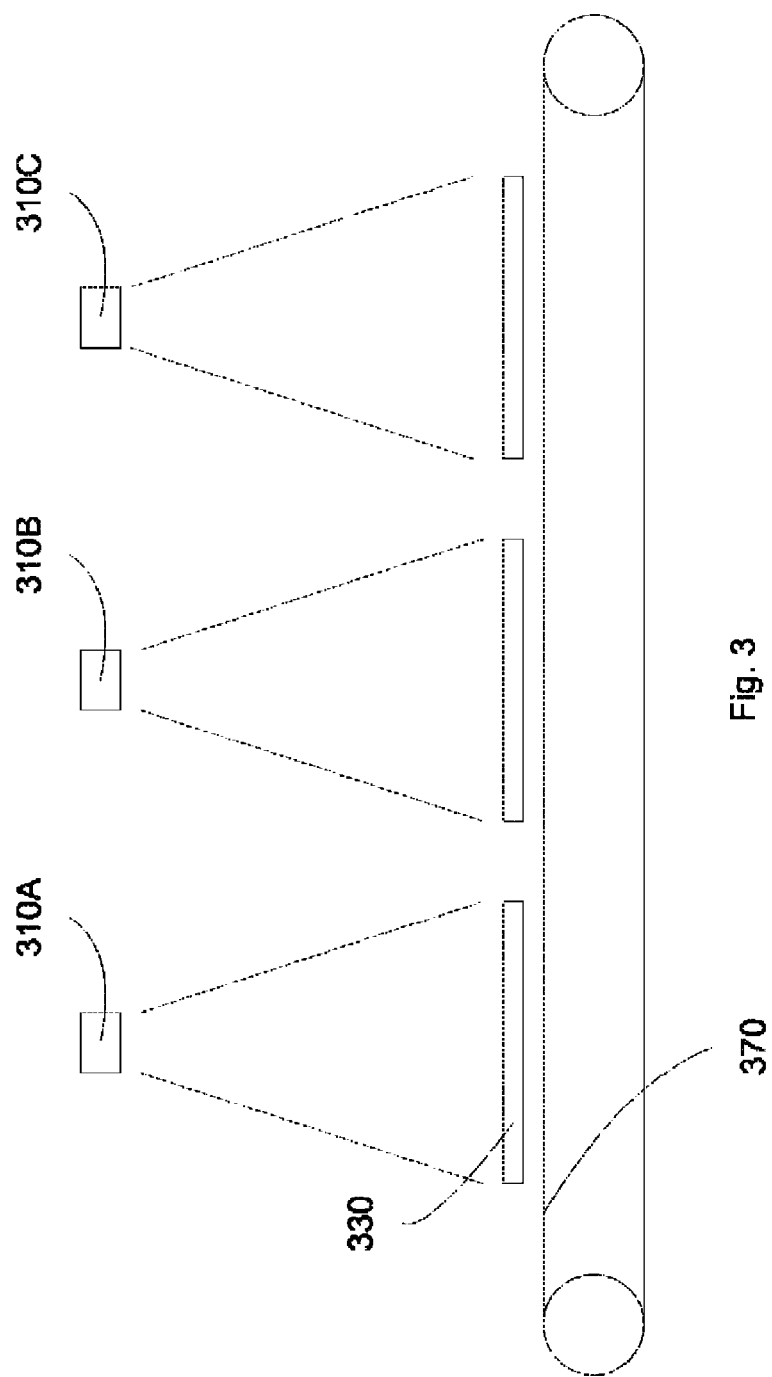

|  | Target | | Sample | |
|---|---|---|---|---|
|  | AC | HT | AC | HT |
| Normal Emissivity (EN) | <0.1 | < AC | 0.052 | 0.041 |
| HT - AC | Rg ΔE* @ 45° | < 4 | 2.81 | |
| | Rg ΔC* | < 4 | 3.20 | |
| | T ΔE* | < 4 | 0.56 | |
| | T \|Δb*\| | < 1 | 0.06 | |
| | T ΔY% (HT > AC) | (0,3) | 0.88 | |
| NFRC 2001 Thermal Performance | Tvis (%) | | 77 | 77.8 |
| | Tsol (%) | | 49.6 | 50.3 |
| | Uval | | 0.25 | 0.245 |
| | SHGC(3) | | 59 | 59.1 |
| | LSG(3) | | 1.3 | 1.32 |

Fig. 5

SEED LAYER FOR LOW-E APPLICATIONS

FIELD OF THE INVENTION

The present invention relates generally to films providing high transmittance and low emissivity, and more particularly to such films deposited on transparent substrates.

BACKGROUND OF THE INVENTION

Sunlight control glasses are commonly used in applications such as building glass windows and vehicle windows, typically offering high visible transmission and low emissivity. High visible transmission can allow more sunlight to pass through the glass windows, thus being desirable in many window applications. Low emissivity can block infrared (IR) radiation to reduce undesirable interior heating.

In low emissivity glasses, IR radiation is mostly reflected with minimum absorption and emission, thus reducing the heat transferred to and from the low emissivity surface. Low emissivity, or low-e, panels are often formed by depositing a reflective layer (e.g., silver) onto a substrate, such as glass. The overall quality of the reflective layer, such as with respect to texturing and crystallographic orientation, is important for achieving the desired performance, such as high visible light transmission and low emissivity (i.e., high heat reflection). In order to provide adhesion, as well as protection, several other layers are typically formed both under and over the reflective layer. The various layers typically include dielectric layers, such as silicon nitride, tin oxide, and zinc oxide, to provide a barrier between the stack and both the substrate and the environment, as well as to act as optical fillers and function as anti-reflective coating layers to improve the optical characteristics of the panel.

Low-emissivity coatings can also be engineered to provide desired shading properties. When sunlight reaches a window, a portion can pass through the window, a portion can be reflected, and a portion can be absorbed, (which can increase the temperature of various parts of the window). A portion of the absorbed heat can radiate to the inside of the building, thus increasing the temperature of the air in the building. Thus, when sunlight is incident upon a glass window, in addition to lighting the interior of the building, the incident solar radiation can also pass through the window to increase the temperature of the building. Solar Heat Gain Coefficient (SHGC) is defined as the fractional amount of the solar energy that strikes a window that contributes to warming the building. Other terms can also be used, such as solar shading property or Light to Solar Gain (LSG), which is used to describe the relationship between lighting and heating from solar irradiation. Light to Solar Gain is defined as the ratio of visible light transmission to solar heat gain coefficient. In the hot weather, it is desirable to have high LSG glass. For example, commercial glass coatings are generally recommended to have LSG greater than 1.8.

There can be a tradeoff between having high visible transmittance and high light to solar gain. Transparent glass can provide high light transmittance but also high solar gain, (e.g., low light to solar gain). Dark glass can provide low solar gain, but also low light transmittance. Low emissivity coatings incorporating silver can provide significant improvements in terms of both visible light transmittance and light to solar gain properties. However, further improvement in light to solar gain is difficult; for example, low emissivity coatings having thicker silver layers, or having multiple silver layers, (e.g., double silver layer or triple silver layer), can reduce the solar heat gain, but at the expense of lower light transmission.

Another desired characteristic of the low-emissivity glass coatings is a color neutral property, (e.g., colorless glass). The glass coatings should not exhibit observable hues, (e.g., more red or blue than is desired).

Another desired characteristic of the low-emissivity glass coatings is temperature stability, (e.g., similar performance and appearance before and after heat treatment). Since glass can be tempered, (e.g., heating the glass to 600-700° C.), the appearance of the low-emissivity coatings can change significantly during the heat treatment process. To accommodate the tempering changes, low-emissivity coatings can be provided in a temperable version (e.g., heat treated) and a non-temperable version (non-heat treated). This is inconvenient in a manufacturing environment since two separate types of inventory must be maintained. The film stack of the temperable version can be designed to have properties matching those of the non-temperable version.

It would be desirable to provide low-emissivity coatings that can provide high visible transmittance, high light to solar gain, color neutral, and thermal stability for color and optical performance.

SUMMARY OF THE DISCLOSURE

In some embodiments, methods, and coated panels fabricated from the methods, are disclosed to form multiple coatings, (e.g., one or more infrared reflective layers), with minimal color change before and after heat treatments. For example, by adding appropriate seed layers between the IR reflective layers and the base oxide layers, the color performance can be maintained regardless of high temperature processes. The optical filler layers can include a metal oxide layer. In some embodiments, the seed layer can include nickel, titanium, and niobium, forming a nickel titanium niobium alloy such as NiTiNb.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 3 illustrates an exemplary in-line deposition system according to some embodiments.

FIG. 5 presents data for before and after a high temperature heat treatment in the format of a scorecard according to some embodiments.

DETAILED DESCRIPTION OF THE DISCLOSURE

Figure 1:
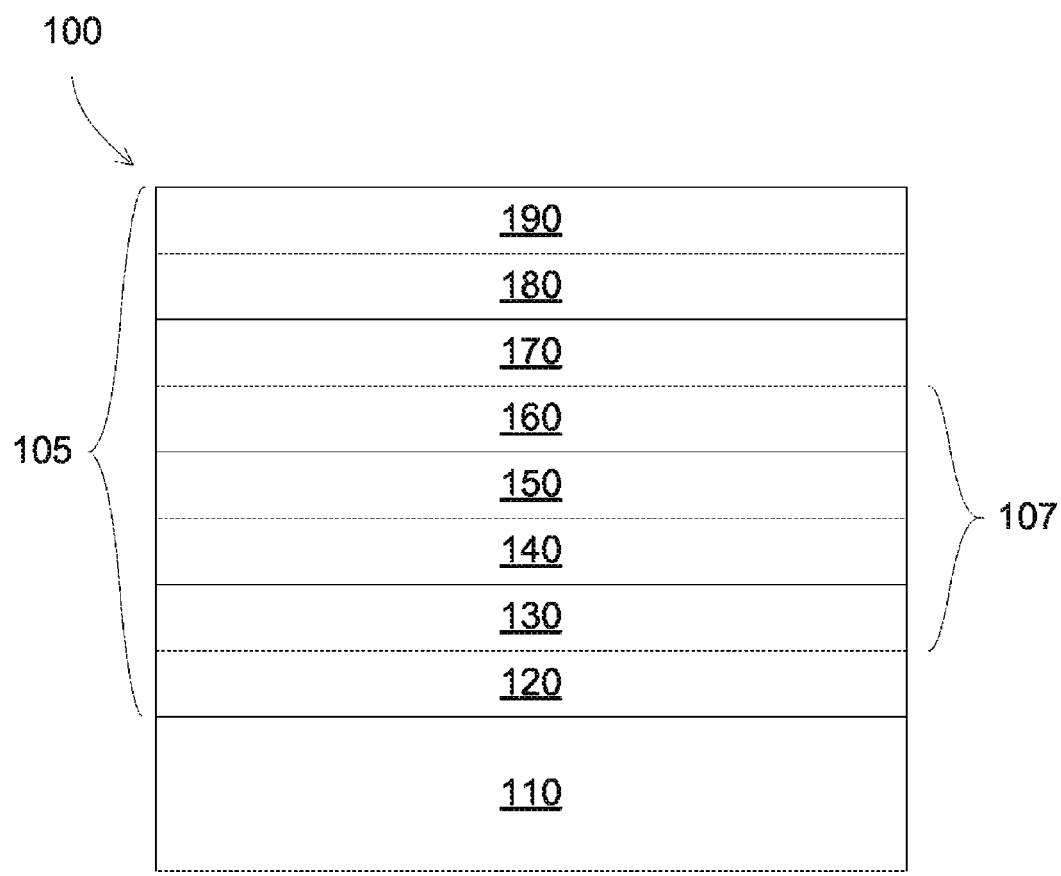
FIG. 1 illustrates a low emissivity transparent panel 100 according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "substrate" as used herein may refer to any workpiece on which formation or treatment of material layers is desired. Substrates may include, without limitation, float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring transparent or non-transparent substrate functionality.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

The term "Solar Heat Gain Coefficient" (SHGC) is defined as the fractional amount of the solar energy that strikes a window that contributes to warming the building.

The term "Light to Solar Gain" (LSG) is defined as the ratio of visible light transmission to solar heat gain coefficient.

As used herein, the notation "Ni—Ti—Nb—O" and "NiTiNbO" and "NiTiNbO$_x$" will be understood to be equivalent and will be used interchangeably and will be understood to include a material containing these elements in any ratio. Where a specific composition is discussed, the atomic concentrations (or ranges) will be provided. The notation is extendable to other materials and other elemental combinations discussed herein.

As used herein, the terms "film" and "layer" will be understood to represent a portion of a stack. They will be understood to cover both a single layer as well as a multi-layered structure (i.e. a nanolaminate). As used herein, these terms will be used synonymously and will be considered equivalent.

In some embodiments, methods, and coated panels fabricated from the methods, are disclosed to form low emissivity coatings that can provide high visible transmission, high light to solar gain, and minimal color change before and after heat treatments. The low emissivity coatings can include one or more infrared reflective layers to increase the light to solar gain property. The low emissivity coatings can include material and thickness optimization to increase the visible transmission property. Further, the low emissivity coatings can include a separation layer between the optical filler layers and the upper protective layers so that the color performance can be maintained regardless of high temperature processes.

In some embodiments, the seed layer can include a metal alloy layer, such as a nickel titanium niobium (e.g. NiTiNb). The thickness of the metal alloy seed layer can be between 1 and 5 nm (e.g., sufficient to serve as a templating layer during the deposition of the upper protective layer).

In some embodiments, the low emissivity coatings can include a Ni—Nb alloy barrier layer for the infrared reflective layers. The Ni—Nb alloy barrier layer can include nickel, niobium, and oxygen, together with titanium, aluminum or chromium. For example, the Ni—Nb alloy barrier layer can include a nickel niobium titanium oxide, such as NiNbTiO$_x$, with x between 10 and 30 at %. For example, the NiNbTiO$_x$ layer can be sputtered deposited in a partial oxygen pressure, (e.g., in a mixture of oxygen and argon), to control the amount of oxygen content in the oxide barrier layer. The thickness of the Ni—Nb alloy barrier layer can be between 1 and 5 nm, (e.g., sufficient to protect the infrared reflective underlayer).

The low emissivity coatings have high visible light transmission and ability to control the solar gain, (either to achieve high solar gain for the cold weather, (e.g. SHGC>0.5), or to achieve low solar gain for hot weather, which requires high light to solar gain (e.g. LSG>2)). Further, the low emissivity coatings can be thermally stable, (e.g. minimal color changes of the glass coatings after a high temperature exposure), for example, R$_g$ΔE<3 (color change of glass side reflection).

In some embodiments, methods and apparatus for making coated panels are disclosed. The coated panels can include coated layers formed thereon, such as one or more low resistivity thin infrared reflective layers having a conductive material such as silver. The infrared reflective layer(s) can include a conductive material, with the percentage of reflectance proportional to the conductivity. Thus, a metallic layer, for example silver, can be used as infrared reflective layer(s) in low emissivity coatings. To maintain the conductivity of the infrared reflective layer against oxidation from deposition of subsequent layers or from subsequent high temperature anneals, a barrier layer can be formed on the infrared reflective layer.

In some embodiments, improved coated transparent panels, such as a coated glass, that has acceptable visible light transmission and IR reflection are disclosed. Methods of producing the improved coated transparent panels, which include specific layers in a coating stack, are also disclosed.

The coated transparent panels can include a glass substrate or any other transparent substrates, such as substrates made of organic polymers. The coated transparent panels can be used in window applications such as vehicle and building windows, skylights, or glass doors, either in monolithic glazings or multiple glazings, with or without a plastic interlayer or a gas-filled sealed interspace.

FIG. 1 illustrates a low emissivity transparent panel 100 according to some embodiments. The low emissivity transparent panel can include a glass substrate 110 and a low emissivity (low-e) stack 105 formed over the glass substrate 110. In some embodiments, the glass substrate 110 is made of a glass, such as borosilicate glass, and has a thickness of, for example, between 1 and 10 millimeters (mm). The substrate 110 may be square or rectangular and about 0.5-2 meters (m) across. In some embodiments, the substrate 110 may be made of, for example, plastic, polycarbonate, or other transparent polymer.

The low-e stack 105 can include a lower protective layer 120, an infrared reflective stack 107, an upper oxide 170, an optical filler layer 180, and an upper protective layer 190. The infrared reflective stack 107 can include a base oxide layer 130, a seed layer 140, a reflective layer 150, and a barrier layer 160. The infrared reflective stack 107 can be repeated for multiple reflective layer applications such as "double-silver (e.g. two reflective stacks)" or "triple silver (e.g. three reflective stacks)" low-e stacks. Some layers can be optional, and other layers can be added, such as interface layers or adhesion layers. Exemplary details as to the functionality provided by each of the layers 120-190 are provided below.

The various layers in the low-e stack 105 may be formed sequentially (i.e., from bottom to top) on the substrate 110 using a physical vapor deposition (PVD) and/or reactive (or plasma enhanced) sputtering processing tool. For example, the layers can be sputtered deposited using different processes and equipment, for example, the targets can be sputtered under direct current (DC), pulsed DC, alternate current (AC), radio frequency (RF) or any other suitable conditions. In some embodiments, the low-e stack 105 is formed over the entire glass substrate 110. However, in some embodiments, the low-e stack 105 may only be formed on isolated portions of the substrate 110.

The lower protective layer 120 is formed on the upper surface of the glass substrate 110. The lower protective layer 120 can include silicon nitride, silicon oxynitride, or other nitride material such as silicon zirconium nitride, to protect the other layers in the stack 105 from diffusion of contaminants from the substrate 110 or to improve the haze reduction properties. In some embodiments, the lower protective layer 120 is made of silicon nitride and has a thickness of, for example, between about 10 nm to 50 nm, such as 25 nm.

The base oxide layer 130 is formed above the lower protective layer 120 and above the substrate 110. The base oxide layer is preferably a metal or metal alloy oxide layer and can serve as an antireflective layer. The base oxide layer 130 may enhance the crystallinity of the reflective layer 150, for example, by enhancing the crystallinity of a seed layer 140 for the reflective layer 150, as is described in greater detail below.

The seed layer 140 can be a seed layer for the IR reflective layer. For example, a nickel titanium niobium metal alloy layer deposited before the deposition of a silver reflective layer can provide a silver layer with lower resistivity, which can improve its reflective characteristics.

In some embodiments, the seed layer 140 can be made of a metal, such as a nickel titanium niobium metal alloy, and has a thickness of, for example, 50 Å or less (1 Å=0.1 nm). Generally, seed layers are relatively thin layers of materials formed on a surface (e.g., a substrate) to promote a particular characteristic of a subsequent layer formed over the surface (e.g., on the seed layer). For example, seed layers may be used to affect the crystalline structure (or crystallographic orientation) of the subsequent layer, which is sometimes referred to as "templating." More particularly, the interaction of the material of the subsequent layer with the crystalline structure of the seed layer causes the crystalline structure of the subsequent layer to be formed in a particular orientation.

For example, a metal seed layer is used to promote growth of the reflective layer in a particular crystallographic orientation. In some embodiments, the metal seed layer is a material with a crystal structure/orientation which promotes growth of the reflective layer in the (111) orientation when the reflective layer has a face centered cubic crystal structure (e.g., silver), which is preferable for low-e panel applications.

In some embodiments, the crystallographic orientation can be characterized by X-ray diffraction (XRD) technique, which is based on observing the scattered intensity of an X-ray beam incident upon the layer, (e.g., the silver layer or seed layer), as a function of the scattered angles.

In some embodiments, the term "silver layer having (111) crystallographic orientation", is understood to mean that there is a (111) crystallographic orientation for the silver layer. The crystallographic orientation can be determined by observing pronounced crystallography peaks in an XRD characterization.

In some embodiments, the seed layer 140 can be continuous and cover the entire substrate. Alternatively, the seed layer 140 may not be formed in a completely continuous manner. The seed layer can be distributed across the substrate surface such that each of the seed layer areas is laterally spaced apart from the other seed layer areas across the substrate surface and, when combined, those areas do not completely cover the substrate surface. For example, the average thickness of the seed layer 140 can be a monolayer or less, such as between 2.0 and 4.0 Å, and the separation between the layer sections may be the result of forming such a thin seed layer (i.e., such a thin layer may not form a continuous layer).

The IR reflective layer 150 is formed above the seed layer 140. The IR reflective layer can be a metallic, reflective film, such as silver, gold, or copper. In general, the IR reflective layer includes a good electrical conductor, blocking the passage of thermal energy. In some embodiments, the IR reflective layer 150 is made of silver and has a thickness of between about 7 nm to about 20 nm. Because the IR reflective layer 150 is formed on the seed layer 140, the growth of the silver IR reflective layer 150 in a (111) crystalline orientation is promoted (e.g. due to the crystallographic orientation of the seed layer 140), which offers low sheet resistance, leading to low panel emissivity.

Because of the promoted (111) textured orientation of the IR reflective layer 150, the conductivity and emissivity of the IR reflective layer 150 is improved. As a result, a thinner reflective layer 150 may be formed that still provides sufficient reflective properties and visible light transmission. Additionally, the reduced thickness of the IR reflective layer 150 allows for less material to be used in each panel that is manufactured, thus improving manufacturing throughput and efficiency, increasing the usable life of the target (e.g., silver) used to form the reflective layer 150, and reducing overall manufacturing costs.

Further, the seed layer 140 can provide a barrier between the base oxide layer 130 and the IR reflective layer 150 to reduce the likelihood of any reaction of the material of the reflective layer 150 and the oxygen in the base oxide layer 130, especially during subsequent heating processes. As a result, the resistivity of the reflective layer 150 may be reduced, thus increasing performance of the reflective layer 150 by lowering the emissivity.

In some embodiments, barrier layers can be formed on an infrared reflective layer to protect the infrared reflective layer from impurity diffusion, together with exhibiting good adhesion and good optical properties, for example, during the fabrication process.

The barrier layer 160 is formed above the IR reflective layer 150. The barrier layer 160 can include at least one of nickel, niobium, titanium, aluminum, or chromium, and oxygen. The silver layer should be as pure as possible to maintain its low emissivity performance. The layer immediately on top of the silver layer (e.g., the barrier layer) can be important in protecting the silver from oxidation, such as during oxygen reactive sputtering processes in the deposition of subsequent layers. In addition, this barrier layer can protect the silver layer against reaction with oxygen diffusion during the glass tempering process or during long term use where the panel may be exposed to moisture or the environment.

In addition to the oxygen diffusion barrier property, there are other desirable properties for the barrier layer. For example, since the barrier layer is placed directly on the silver layer, low or no solubility of the barrier material in silver is desirable to minimize reactivity between the barrier layer and silver at the interface. The reaction between the barrier layer and silver can introduce impurities in the silver layer, potentially reducing the conductivity.

Upper oxide layer 170 is formed above the barrier layer 160 which can function as an antireflective film stack, including a single layer or multiple layers having different functional purposes. The upper oxide layer 170 can serve to reduce the reflection of visible light. The upper oxide layer 170 can be selected based on transmittance, index of refraction, adherence, chemical durability, and thermal stability. In some embodiments, the upper oxide layer 170 includes zinc tin oxide (ZnSnO), offering high thermal stability properties. The upper oxide layer 170 can also include titanium dioxide, silicon nitride, silicon dioxide, silicon oxynitride, niobium oxide, silicon zirconium nitride, tin oxide, zinc oxide, or any other suitable dielectric material.

The optical filler layer 180 can be used to provide a proper thickness to the low-e stack, (e.g. to provide an antireflective property). The optical filler layer preferably has high visible light transmittance. In some embodiments, the optical filler layer 180 is made of tin oxide or zinc oxide and has a thickness of, for example, between 3 nm and 60 nm, such as between 3 nm and 20 nm. In some embodiments, the optical filler layer 180 is made of zinc tin oxide (ZnSnO) and has a thickness of, for example between 3 nm and 60 nm, such as between 3 nm and 20 nm. The optical filler layer may be used to tune the optical properties of the low-e panel 100. For example, the thickness and refractive index of the optical filler layer may be used to increase the layer thickness to a multiple of the incoming light wavelengths, effectively reducing the light reflectance and improving the light transmittance.

An upper protective layer 190 is formed above the optical filler layer 180 and can be used for protecting the total film stack, to protect the panel from physical or chemical abrasion. The upper protective layer 190 can be an exterior protective layer, such as silicon nitride, silicon oxynitride, titanium oxide, tin oxide, zinc oxide, niobium oxide, or silicon zirconium nitride.

In some embodiments, adhesion layers can be used to provide adhesion between layers. The adhesion layers can be made of a metal alloy, such as nickel-titanium, and have a thickness of, for example, 30 Å.

Depending on the materials used, some of the layers of the low-e stack 105 may have some elements in common. An example of such a stack may use a zinc-based material in the oxide dielectric layers 130 and 170. As a result, a relatively low number of different sputtering targets can be used for the formation of the low-e stack 105.

Further, in the fabrication of low emissivity coated panels, high temperature processes can be used to anneal the deposited films or to temper the substrate. The high temperature processes can have adverse effects on the low emissivity coating, such as changing the structure or the optical properties, (e.g., index of refraction n or absorption coefficient k), of the coated films. Thus thermal stability with respect to optical properties is desirable.

In some embodiments, the coating can include multiple infrared reflective stacks 107, such as double or triple infrared reflective stacks with two or three infrared reflective silver layers.

In some embodiments, the effects of the deposition process of the layers deposited above the silver IR reflective layer on the quality of the silver IR reflective layer are disclosed. Since the silver IR reflective layer is desirably thin, (e.g. less than 20 nm, to provide high visible light transmission), the quality of the silver IR reflective layer can be affected by the deposition of the subsequently deposited layers, such as the barrier layer or the antireflective layer.

In some embodiments, sputter deposition processes, which can be used to apply a metal alloy seed layer on which an IR reflective layer can be deposited, are disclosed. For example, the metal alloy seed layer can serve as a template for the IR reflective layer. The metal alloy seed layer can function as a barrier layer under the IR reflective layer. In some embodiments, the metal alloy seed layer can be sputtered from an alloyed target, or co-sputtered from different elemental targets onto the same substrate.

Figure 2A:
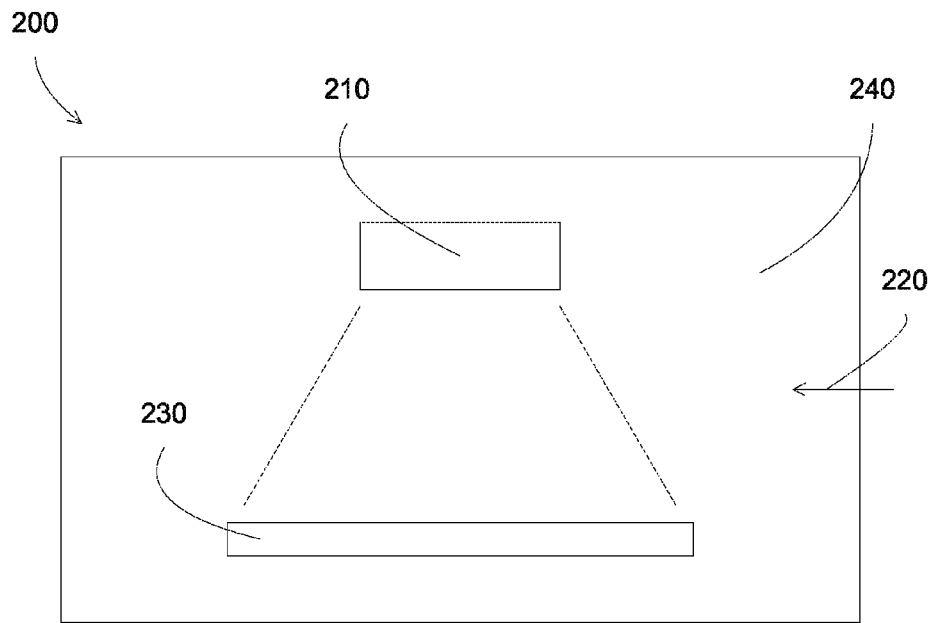
FIGS. 2A-2B illustrate physical vapor deposition (PVD) systems according to some embodiments.
Figure 2B:
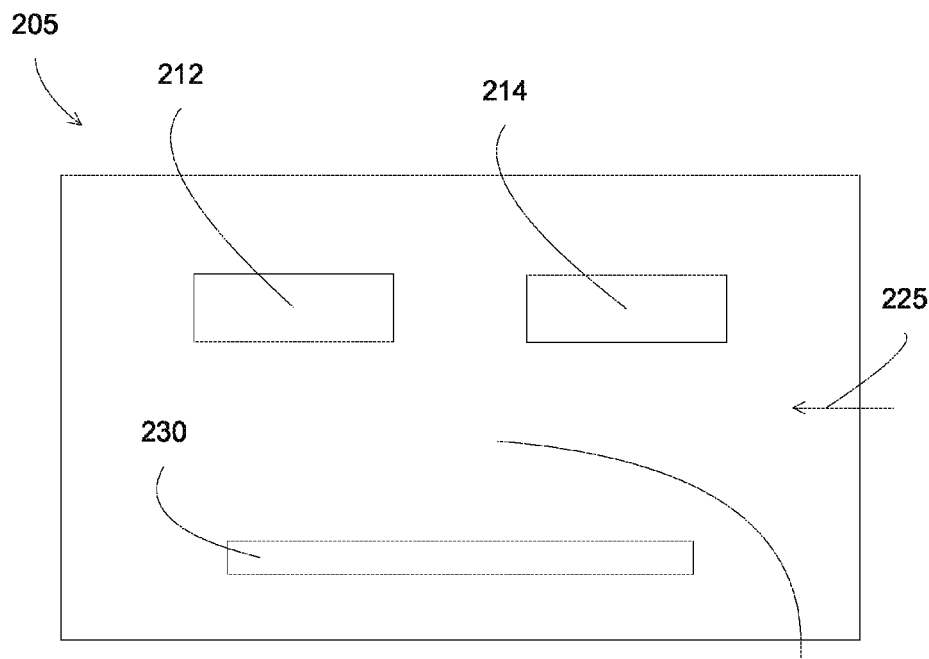

FIGS. 2A-2B illustrate physical vapor deposition (PVD) systems according to some embodiments. In FIG. 2A, a PVD system, also commonly called sputter system or sputter deposition system, 200 includes a housing that defines, or encloses, a processing chamber 240, a substrate 230, a target assembly 210, and reactive species delivered from an outside source through a gas inlet 220. During deposition, the target is bombarded with argon ions, which releases sputtered particles toward the substrate 230. The sputter system 200 can perform blanket deposition on the substrate 230, forming a deposited layer that covers the whole substrate, (e.g., the area of the substrate that can be reached by the sputtered particles generated from the target assembly 210).

The materials used in the target of target assembly 210 may include nickel, niobium and titanium for the metal alloy seed layer, silver for the IR reflective layer, and other metals for other layers. Additionally, the materials used in the targets may include oxygen, nitrogen, or a combination of oxygen and nitrogen in order to form the oxides, nitrides, and oxynitrides of the metals described above. The different targets can be used to deposit different layers in the low-e coating stack, in addition to the metal alloy seed layer. Additionally, although only one target assembly 210 is shown, additional target assemblies may be used. As such, different combinations of targets may be used to form the dielectric layers described above. For example, in some embodiments in which the dielectric material is zinc-tin-oxide, the zinc and the tin may be provided by separate zinc and tin targets, or they may be provided by a single zinc-tin alloy target. A target assembly 210 can include a silver target to sputter deposit a silver layer on substrate 230. The target assembly 210 can include a metal or metal alloy target, and together with reactive species of oxygen and/or nitrogen to sputter deposit a metal alloy oxide layer, a metal alloy nitride layer, or a metal alloy oxynitride layer.

The sputter deposition system 200 can include other components, such as a substrate support for supporting the substrate. The substrate support can include a vacuum chuck, electrostatic chuck, or other known mechanisms. The substrate support can be capable of rotating around an axis thereof that is perpendicular to the surface of the substrate. In addition, the substrate support may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

In some embodiments, the substrate support includes an electrode which is connected to a power supply to provide a RF or DC bias to the substrate, or to provide a plasma environment in the processing chamber 240. The target assembly 210 can include an electrode which is connected to a power supply to generate a plasma in the process housing. The target assembly 210 is preferably oriented towards the substrate 230.

The sputter deposition system 200 can also include a power supply coupled to the target electrode. The power supply provides power to the electrodes, causing material to be sputtered from the target. During sputtering, inert gases, such as argon or krypton, may be introduced into the processing chamber 240 through the gas inlet 220. In embodiments in which reactive sputtering is used, reactive gases may also be introduced, such as oxygen and/or nitrogen, which interact with particles ejected from the targets to form oxides, nitrides, and/or oxynitrides on the substrate.

The sputter deposition system 200 can also include a control system (not shown) having a processor and a memory, which is in operable communication with the other components and configured to control the operation thereof in order to perform the methods described herein.

FIG. 2B shows a sputter system having co-sputtering targets according to some embodiments. A sputter deposition chamber 205 can include two target assemblies 212 and 214 (or other numbers of targets) disposed in a plasma environment 245, containing reactive species delivered from an outside source 225. For example, the target assemblies 212 and 214 can include the metal elements of the metal alloy seed oxide layer, (e.g., nickel, titanium, and niobium) to deposit an alloy of nickel-titanium-niobium on substrate 230. This configuration serves as an example, and other sputter system configurations can be used, such as a single target having an alloy material.

In some embodiments, methods and apparatus for making low emissivity panels, including forming an IR reflective layer formed over a metal alloy seed layer that includes an alloy of nickel titanium and niobium are disclosed. The panels can exhibit improved IR reflectance, improved color neutrality, thermal stability, and durability due to the metal alloy seed layer templating the IR reflective layer while not degrading the low emissivity coating characteristics.

In some embodiments, methods for making low emissivity panels in large area coaters are disclosed. A transport mechanism can be provided to move a substrate under one or more sputter targets, to deposit a conductive layer underlayer before depositing a barrier layer, an antireflective layer, together with other layers such as a surface protection layer.

In some embodiments, in-line deposition systems, including a transport mechanism for moving substrates between deposition stations are disclosed.

FIG. 3 illustrates an exemplary in-line deposition system according to some embodiments. A transport mechanism 370, such as a conveyor belt or a plurality of rollers, can transfer substrate 330 between different sputter deposition stations. For example, the substrate can be positioned at station #1, having a target assembly 310A, then transferred to station #2, having target assembly 310B, and then transferred to station #3, having target assembly 310C. The station #1 having target assembly 310A can be a metal alloy seed layer deposition station, sputtering a metal alloy seed layer including nickel, titanium, and niobium. As shown, the station #1 includes a single target assembly 310A. However, other configurations can be used, such as co-sputtering system utilizing multiple targets. The station #2 having target assembly 310B can be an IR reflective layer deposition station, sputtering a silver layer. The station #3 having target 310C assembly can be used to deposit other layers, such as an barrier layers or antireflective layers or protection layers.

In some embodiments, methods, and coated panels fabricated from the methods, are disclosed include multiple coatings (e.g., multiple infrared reflective layers) with minimal color change before and after heat treatments. The methods can include forming a metal alloy seed layer under each of the IR reflective layers. The metal alloy seed layers can include a metal alloy layer, such as a nickel titanium niobium alloy (e.g. NiTiNb) layer.

In some embodiments, a low emissivity stack is provided, which can have high visible light transmission, high light to solar gain, color neutrality, and small color change after thermal cycles. The low emissivity stack can include a lower protection layer, such as silicon nitride, on a glass substrate. The thickness of the silicon nitride can be between 10 and 30 nm. Above the silicon nitride layer is formed an infrared reflective stack. The infrared reflective stack can include (from top to bottom) a barrier layer, such as $NiNbTiO_x$, formed above an infrared reflective layer, such as silver, formed above a seed layer, such as NiTiNb, formed above a base oxide layer, such as AlSnO or $Zn_2SnO_x$. The thickness of the $NiNbTiO_x$ barrier layer can be between 1 and 5 nm. The thickness of the silver layer can be between 6 and 30 nm. The thickness of the NiTiNb seed layer can be between 0.5 and 3 nm. The thickness of the AlSnO or $Zn_2SnO_x$ base oxide layer can be between 10 and 40 nm. Additional infrared reflective stacks can be formed above the first infrared reflective stack. Above the infrared reflective stack(s) is an upper oxide layer, such as ZnSnO. The thickness of the ZnSnO upper oxide layer can be between 10 and 40 nm. Above the upper oxide layer is formed an optical filler layer. The thickness of the optical filler layer can be between 3 and 60 nm. Above the optical filler layer is an upper protective layer, such as silicon nitride. The thickness of the silicon nitride upper protective layer can be between 10 and 30 nm.

Figure 4:
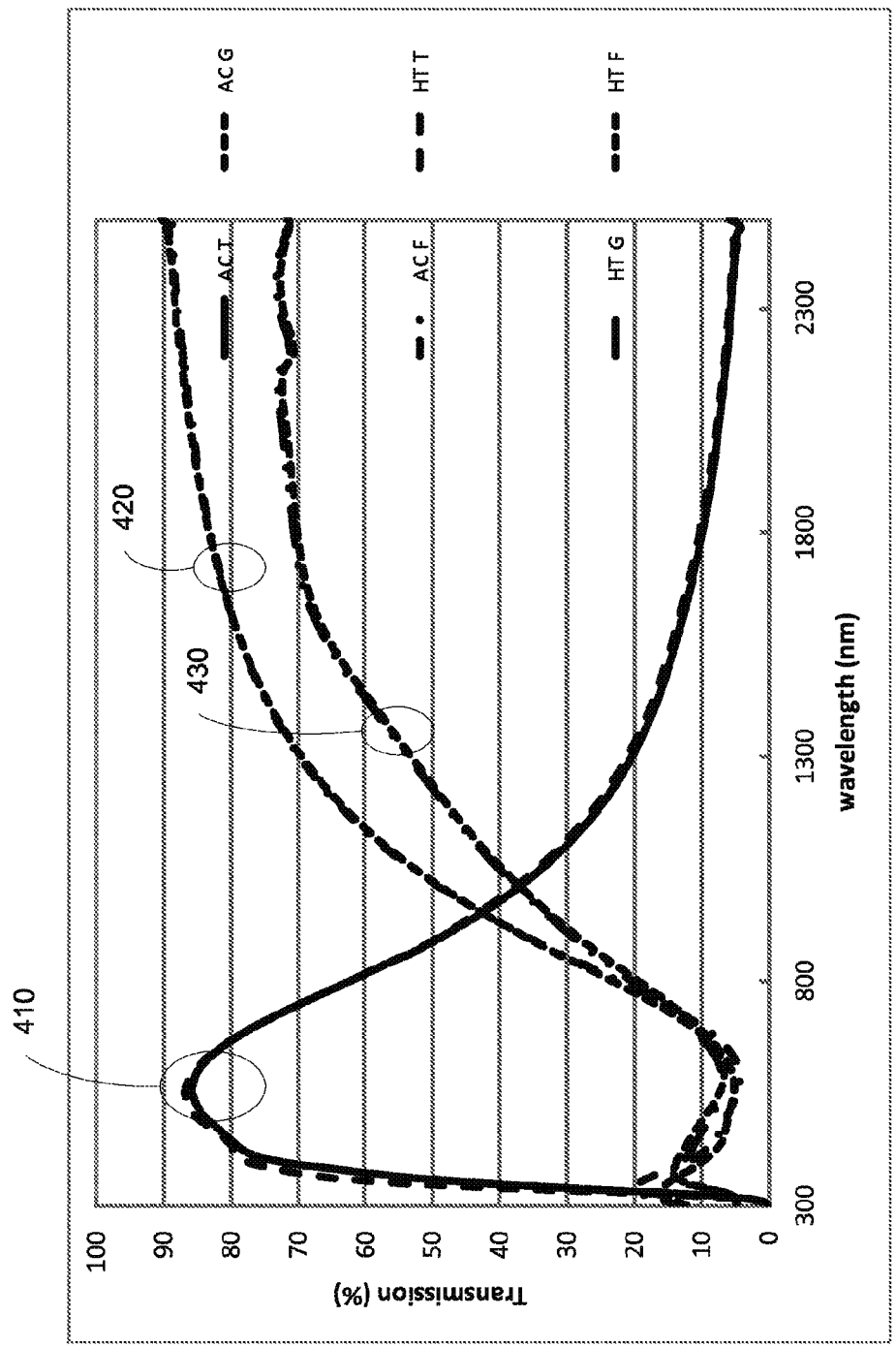
FIG. 4 illustrates the transmission and reflection of the low emissivity stack before and after a high temperature heat treatment according to some embodiments.

Optical properties of the low emissivity stacks were measured before and after the heat treatment. FIG. 4 illustrates the transmission and reflection of the low emissivity stacks before and after a high temperature heat treatment according to some embodiments. FIG. 4 presents data for the low emissivity stacks with the use of the NiTiNb metal alloy seed layer. The solid and dashed curves 410 show the transmission response through the low emissivity stack. High transmission, (e.g., maximum above 80%), can be achieved for the visible light range, (e.g., between 400 and 750 nm). The solid and dashed curves 420 show the reflection response from the coating side. Low reflection, (e.g., minimum below 10%), can be achieved for the visible light range, (e.g., between 400 and 750 nm). High reflection, (e.g., maximum above 80%), can be achieved for the infrared range, (e.g., between 800 and 2300 nm—not shown). The solid and dashed curves 430 show the reflection response from the glass side. Low reflection, (e.g., minimum below 10%), can also be achieved for the visible light range, (e.g., between 400 and 750 nm). High reflection, (e.g., maximum above 80%), can be achieved for the infrared range, (e.g., between 800 and 2300 nm—not shown).

The solid curves represent the optical spectra for the as-coated low emissivity stack. The dashed curves represent the optical spectra for the high temperature heat treated low emissivity stack. As can be seen, there is minimum difference between the optical spectra of the transmission and reflection of the low emissivity stack before and after the heat treatment when the NiTiNb metal alloy seed layer is used.

Other characteristics of the low emissivity stack are shown in FIG. 5. "AC" represents data for the as-coated low emissivity stack. "HT" represents data for the low emissivity stack after a high temperature treatment (e.g. tempering). The columns labeled "spec" present target values for the optical and thermal properties of the low-e stack. The columns labeled "-03" present data for the low emissivity stack with the NiTiNb metal alloy seed layer. Data are presented for monolithic coated stacks. Due to the distribution of cones in the eye, the color observance can depend on the observer's field of view. Standard (colorimetric) observer is used, which was taken to be the chromatic response of the average human viewing through a 2 degree angle, due to the belief that the color-sensitive cones reside within a 2 degree arc of the fovea. Thus the measurements are shown for the 2 degree Standard Observer.

Intensity of reflected visible wavelength light, (e.g., "reflectance") is defined for glass side "g" or for film side "f". Intensity from glass side reflectance, (e.g., $R_gY$), shows light intensity measured from the side of the glass substrate opposite the side of the coated layers. Intensity from film side reflectance, (e.g., $R_fY$), shows light intensity measured from the side of the glass substrate on which the coated layers are formed. Transmittance, (e.g., TY), shows light intensity measured for the transmitted light.

Color characteristics are measured and reported herein using the CIE LAB a*, b* coordinates and scale (i.e. the CIE a*b* diagram, Ill. CIE-C, 2 degree observer). In the CIE LAB color system, the "L*" value indicates the lightness of the color, the "a*" value indicates the position between magenta and green (more negative values indicate stronger green and more positive values indicate stronger magenta), and the "b*" value indicates the position between yellow and blue (more negative values indicate stronger blue and more positive values indicate stronger yellow).

Emissivity (E) is a characteristic of both absorption and reflectance of light at given wavelengths. It can usually represented as a complement of the reflectance by the film side, (e.g., $E=1-R_f$). For architectural purposes, emissivity values can be important in the far range of the infrared spectrum, (e.g. about 2,500-40,000 nm). Thus the emissivity value reported here includes normal emissivity (EN), as measured in the far range of the infrared spectrum. Haze is a percentage of light that deviates from the incident beam greater than 2.5 degrees on the average.

Data are also shown for the difference between heat treated and as-coated low emissivity stacks. The value ΔE* (and Δa*, Δb*, ΔY) are important in determining whether or not upon heat treatment (HT) there is matchability, or substantial matchability, of the coated panels. For purposes of example, the term Δa*, for example, is indicative of how much color value a* changes due to heat treatment. Also, ΔE* is indicative of the change in reflectance and/or transmittance (including color appearance) in a coated panel after a heat treatment. ΔE* corresponds to the CIELAB Scale L*, a*, b*, and measures color properties before heat treatment ($L^*_0, a^*_0, b^*_0$) and color properties after heat treatment ($L^*_1, a^*_1, b^*_1$):

$$\Delta E^* = \sqrt{(\Delta L^*)^2 + (\Delta a^*)^2 + (\Delta b^*)^2}$$

where:

$$\Delta L^* = L^*_1 - L^*_0$$

$$\Delta a^* = a^*_1 - a^*_0$$

$$\Delta b^* = b^*_1 - b^*_0$$

The color change of glass side reflection can be calculated as $R_g\Delta E^*$. The color change of light transmission can be calculated as TΔE*, T|Δa*| and T|Δb*|. The luminance change of light transmission can be calculated as TΔY.

As can be seen from FIG. 5, the low emissivity stacks described herein can show a change in visible transmittance (TΔY %) of about 85-90%, and a $R_g\Delta E^*$ value (i.e. the color change on the glass side) when comparing the as coated (i.e. "AC") and the heat treated (i.e. "HT") data (i.e. "HT–AC") of less than 3. Desirable values of $R_g\Delta E^*$ are less than 4.0. The data collected according to the NFRC 2001 Thermal Performance protocol indicate that there is almost no difference between the as coated (i.e. "AC") and the heat treated (i.e. "HT") samples.

Figure 6:
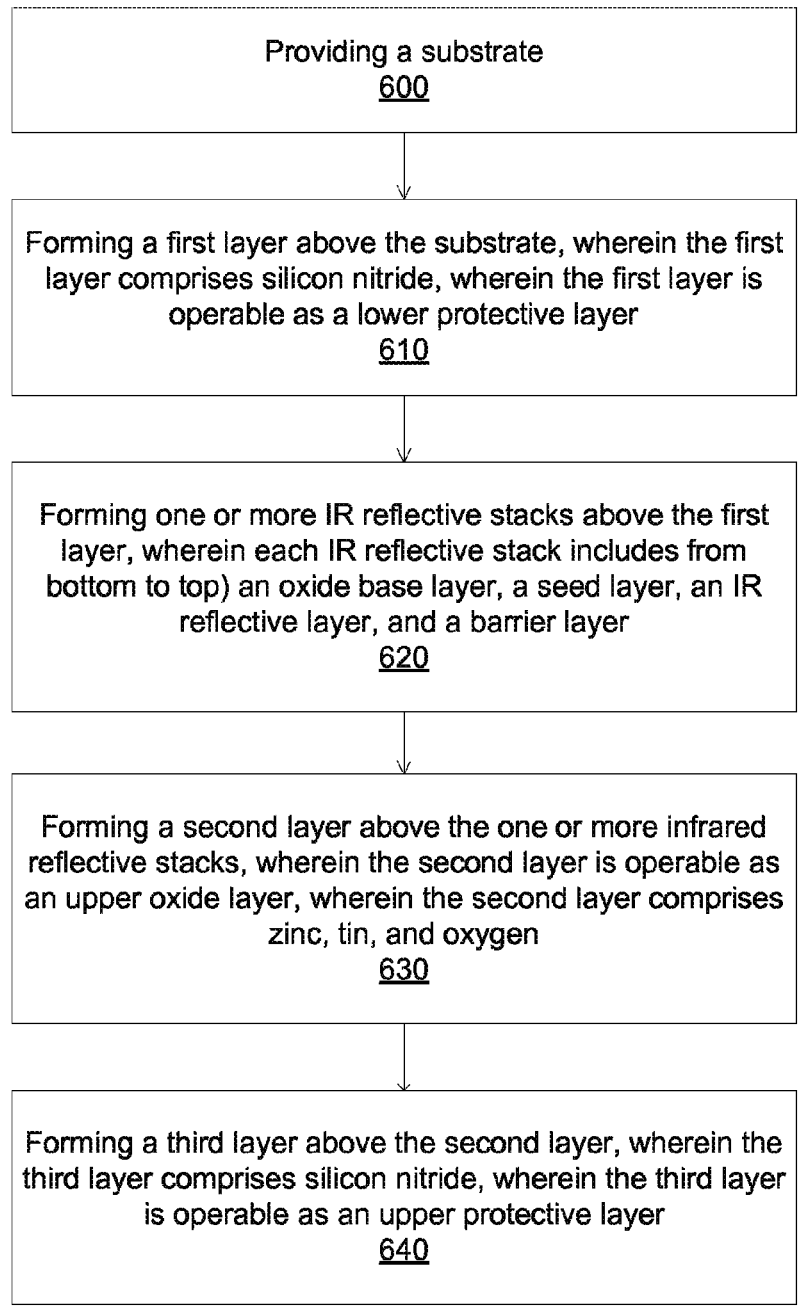
FIG. 6 illustrates a flow chart for sputtering coated layers according to some embodiments.

FIG. 6 illustrates a flow chart for sputtering coated layers according to some embodiments. At least one IR reflective stack is formed sequentially on a substrate, together with a metal alloy seed layer between a base dielectric layer and the IR reflective layer. The metal alloy seed layer can include a nickel titanium niobium alloy (e.g. NiTiNb). In addition, a NiNb alloy (e.g. NiTiNbO) can be used as a barrier layer for the silver layers.

In operation 600, a substrate is provided. The substrate can be a transparent substrate, such as a glass substrate, a polymer substrate, or other substrates discussed previously.

In operation 610, a first layer is formed on the substrate. The first layer can be operable as a lower protective layer. In some embodiments, the first layer can include silicon nitride. The thickness of the first layer can be between about 10 and 30 nm.

In operation 620, one or more infrared reflective stacks are formed above the first layer. Each of the one or more infrared reflective stacks can include (from bottom to top) a base oxide layer, a seed layer, an IR reflective layer, and a barrier layer. In some embodiments, the base oxide layer can include zinc tin oxide. In some embodiments, the seed layer can include a NiTiNb alloy. In some embodiments, the IR reflective layer can include silver. In some embodiments, the barrier layer can include NiTiNbO.

In operation 630, a second layer is formed above the one or more infrared reflective stacks. The second layer can be operable as an upper oxide layer. The second layer can include zinc tin oxide. The thickness of the second layer can be between 5 and 100 nm.

In operation 640, a third layer is formed above the second layer. The third layer can be operable as an upper protective layer. The third layer can include silicon nitride. The thickness of the third layer can be between 10 and 30 nm.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A coated article comprising
a transparent substrate;
a first layer formed above the transparent substrate,
  wherein the first layer comprises silicon nitride,
  wherein the first layer is operable as a lower protective layer;
an IR reflective stack formed above the first layer,
  wherein the IR reflective stack comprises a base oxide layer, a seed layer, an IR reflective layer, and a barrier layer,
  wherein the seed layer is formed directly on the base oxide layer,
  the IR reflective layer is formed directly on the seed layer,
  and the barrier layer is formed directly on the IR reflective layer,
    wherein each of the seed layer and the barrier layer comprises nickel, titanium, and niobium;
a second layer formed directly on the barrier layer of the IR reflective stack,
  wherein the second layer comprises zinc, tin, and oxygen,
  wherein the second layer is operable as an upper oxide layer;
a third layer formed directly on the second layer,
  wherein the third layer consists of zinc oxide; and
a fourth layer formed above the third layer,
  wherein the fourth layer comprises silicon nitride,
  wherein the fourth layer is operable as an upper protective layer.

2. A coated article as in claim 1 wherein a thickness of the second layer is between 1 and 100 nm.

3. A coated article as in claim 1 wherein a thickness of the fourth layer is between 10 and 30 nm.

4. A coated article as in claim 1 wherein the coated article has been heated after forming the fourth layer.

5. A coated article as in claim 4 wherein the transparent substrate comprises glass, and an $R_g\Delta E^*$ value defining a color change of the coated article after the heating is less than 3.0.

6. A coated article as in claim 1 wherein:
the base oxide layer of the IR reflective stack comprises zinc, tin, and oxygen; and
the IR reflective layer of the IR reflective stack comprises silver.

7. A low emissivity film stack comprising
a transparent substrate, wherein the transparent substrate comprises glass;
a first layer formed above the transparent substrate,
  wherein the first layer is operable as a lower protective layer;
an IR reflective stack formed above the first layer,
  wherein the IR reflective stack comprises a base oxide layer, a seed layer, an IR reflective layer, and a barrier layer,
  wherein the seed layer is formed directly on the base oxide layer,
  the IR reflective layer is formed directly on the seed layer,
  and the barrier layer is formed directly on the IR reflective layer,
    wherein each of the seed layer and the barrier layer comprises nickel, titanium, and niobium;
a second layer formed directly on the barrier layer of the IR reflective stack,
  wherein the second layer is operable as an upper oxide layer and comprises zinc, tin, and oxygen;
a third layer formed directly on the second layer,
  wherein the third layer consists of zinc oxide; and
a fourth layer formed above the third layer,
  wherein the fourth layer is operable as an upper protective layer.

8. A low emissivity film stack as in claim 7 wherein a thickness of the second layer is between 0.5 and 3 nm.

9. A low emissivity film stack as in claim 7 wherein a thickness of the fourth layer is between 10 and 30 nm.

10. A low emissivity film stack as in claim 7 wherein the coated article has been heated after forming the fourth layer.

11. A low emissivity film stack as in claim 10 wherein an $R_g\Delta E^*$ value defining a color change of the coated article after the heating is less than 3.0.

12. A low emissivity film stack as in claim 7 wherein:
the base oxide layer of the IR reflective stack comprises zinc, tin and oxygen, and
the IR reflective layer of the IR reflective stack comprises silver.

13. A low emissivity film stack comprising:
a transparent substrate;
a lower protective layer formed directly on the transparent substrate, wherein the protective layer comprises silicon nitride, silicon oxynitride, or silicon zirconium nitride;
a base layer formed directly on the lower protective layer, wherein the base layer comprises zinc, tin, and oxygen;
a seed layer formed directly on the base layer, wherein the seed layer comprises nickel, titanium, and niobium;
a reflective layer formed directly on the seed layer, wherein the reflective layer comprises silver, gold, or copper;
a barrier layer formed directly on the reflective layer, wherein the barrier layer comprises nickel, titanium, and niobium;
an oxide layer formed directly on the barrier layer, wherein the oxide layer comprises zinc, tin, and oxygen;
an optical filler layer formed directly on the oxide layer, wherein the optical filler layer consists of zinc oxide; and
an upper protective layer formed above the optical filler layer, wherein the upper protective layer comprises silicon nitride, silicon oxynitride, titanium oxide, tin oxide, zinc oxide, niobium oxide, or silicon zirconium nitride.

14. A low emissivity film stack as in claim 13 wherein each of the seed layer and the barrier layer comprises a nickel titanium niobium metal alloy or nickel titanium niobium oxide.

15. A low emissivity film stack as in claim 14 wherein each of the seed layer and the barrier layer consist of a nickel titanium niobium metal alloy or nickel titanium niobium oxide.

16. A low emissivity film stack as in claim 15 wherein the reflective layer consists of silver, and the transparent substrate comprises glass.

17. A low emissivity film stack as in claim 16 wherein each of the base layer and the oxide layer consists of zinc tin oxide.

18. A low emissivity film stack as in claim 17 wherein each of the lower protective layer and the upper protective layer consists of silicon nitride.

19. A low emissivity film stack as in claim 18 wherein the upper protective layer is formed directly on the optical filler layer.

\* \* \* \* \*